(12) United States Patent
Zabler et al.

(10) Patent No.: US 6,288,551 B1
(45) Date of Patent: Sep. 11, 2001

(54) SYSTEM FOR CONTROLLING THE RESISTANCE OF A LOAD CONNECTED TO A TRANSFORMER

(75) Inventors: Erich Zabler, Stutensee; Anton Dukart, Wörth, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/011,850

(22) PCT Filed: Apr. 25, 1996

(86) PCT No.: PCT/DE96/00722

§ 371 Date: Feb. 18, 1998

§ 102(e) Date: Feb. 18, 1998

(87) PCT Pub. No.: WO97/06978

PCT Pub. Date: Feb. 27, 1997

(30) Foreign Application Priority Data

Aug. 19, 1995 (DE) .............................. 195 30 586

(51) Int. Cl.⁷ .......................... G01R 31/00; G01R 31/08; G01R 31/02; G01R 27/28
(52) U.S. Cl. .......................... 324/502; 324/547; 324/525; 324/550; 324/649

(58) Field of Search .................................. 324/550, 502, 324/718, 715, 445, 547, 544, 649, 691, 525

(56) References Cited

U.S. PATENT DOCUMENTS

| | | | | |
|---|---|---|---|---|
| 4,837,501 | * | 6/1989 | Fry | 324/715 |
| 4,851,761 | * | 7/1989 | Matsuno | 324/715 |
| 5,341,102 | * | 8/1994 | Akiyama | 324/445 |

FOREIGN PATENT DOCUMENTS

| | | | |
|---|---|---|---|
| 3540031 | * | 2/1987 | (DE) . |
| 3812633 | * | 10/1989 | (DE) . |
| 38 12 633 | | 10/1989 | (DE) . |
| 2576109 | * | 7/1986 | (FR) . |
| WO 87/07388 | * | 2/1987 | (WO) . |

* cited by examiner

*Primary Examiner*—Safet Metjahic
*Assistant Examiner*—Anjan K Deb
(74) *Attorney, Agent, or Firm*—Kenyon & Kenyon

(57) ABSTRACT

In an arrangement that can be implemented with a simple circuit, the load is connected in parallel to an additional resistor. The primary-side input resistance of the transformer is measured, and when the input resistance differs from a predefined value, a load malfunction is signaled.

7 Claims, 2 Drawing Sheets

SYSTEM FOR CONTROLLING THE RESISTANCE OF A LOAD CONNECTED TO A TRANSFORMER

FIELD OF THE INVENTION

The present invention relates to an arrangement for checking the resistance of a load, preferably the squib of an air bag, connected to the secondary winding of a transformer.

BACKGROUND INFORMATION

Such an arrangement is described in German Patent No. 38 12 633 A1. According to this related art, a rotary transformer is used, for example, for signal transmission between a controller and an air bag built into the steering wheel of a vehicle. The functionality of an air bag must be tested on an ongoing basis to ensure that it is ready to operate in an emergency situation. For this purpose, the resistance of the squib, which should typically be between 1.8 Ω and 2.5 Ω, is periodically measured. The transmission of signals using inductively coupled windings of the rotary transformer depends on the distance between the two windings, i.e., the size of the gap between the pot-type cores of the windings. Assembly and manufacturing tolerances of the steering wheel, on which the secondary-side pot-type core of the rotary transformer is installed, can distort the measured resistance value of the squib. In order to avoid such measuring signal distortions, the aforementioned related art provides an oscillating circuit on the secondary side of the rotary transformer, which is excited by a control signal from the primary side. After the control signal is switched off, the decay of the response signals of the oscillating circuit is retransmitted back to the primary side and the secondary side resistance is obtained from the time constant of the decaying response signal.

SUMMARY OF THE INVENTION

According to the present invention, the resistance of a load, preferably the squib of an air bag, connected to the secondary side of a rotary transformer, is checked using an additional resistor connected in parallel to the load. The input resistance of the transformer, measured on the primary side, is a single-valued function of the load resistance. This input resistance is measured and, if it differs from a predefined value, it is signaled that a load malfunction has occurred. The additional resistor can be transformed into the primary side of the transformer using an additional secondary winding. It is convenient that the additional secondary winding be made from a wire that has this additional resistance. The additional resistor can, however, also be designed as a ring arranged on the secondary side. One advantage of the arrangement according to the present invention is that it can be implemented with a very simple circuit and allows reliable conclusions to be drawn regarding the changes in the load resistance.

DETAILED DESCRIPTION

A load resistance connected to the secondary side of a transformer is to be checked for changes from the primary side. The transformer may be a rotary transformer, for example, arranged between a steering wheel equipped with an air bag and the stationary steering column. The load connected on the secondary side then corresponds to the resistance of an air bag squib. Such a squib normally has a resistance of approximately 2 Ω. If the resistance of the squib changes, this indicates that the function of the air bag has been impaired. Such a situation must be signaled in the vehicle. The squib resistance is periodically checked.

Figure 1:
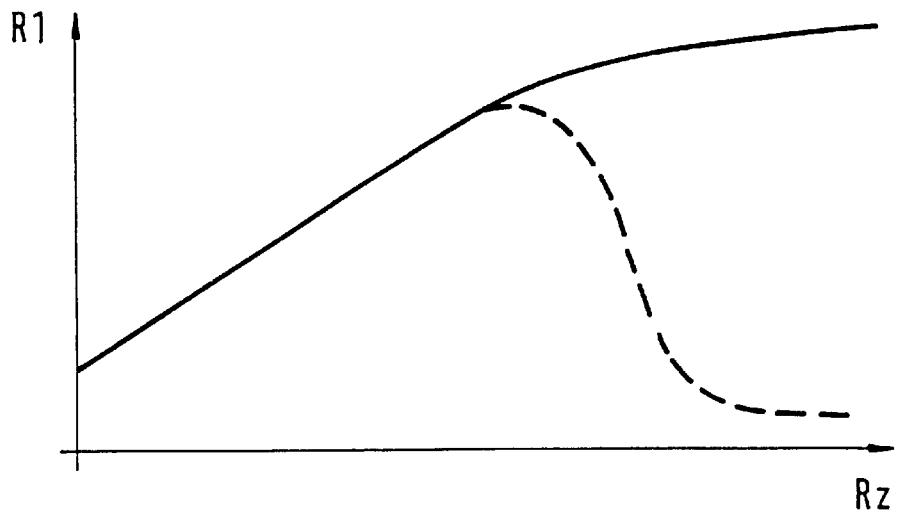
FIG. 1 shows the input resistance measured on the primary side as a function of a load resistance connected to the secondary side.

The input resistance R1 of a transformer (with almost no iron losses), measured on the primary side, is a function of load resistance Rz connected to the secondary side, as schematically shown in FIG. 1. As can be seen from FIG. 1, for small load resistances, input resistance R1 on the primary side is a linear function of secondary-side load resistance Rz. However, if load resistance Rz increases, for example, because its connection to the secondary winding is partially or totally severed, the input resistance drops to a small value, approximately corresponding to that of the effective resistance of the primary winding. Then input resistance R1 as a function of load resistance Rz approximately follows the curve shown as a dashed line. The measured input resistance R1 is no longer a single-valued function of resistance Rz of the load connected to the secondary side. This shortcoming can be overcome by connecting an additional resistor R in parallel to load resistance Rz (see FIG. 2). Additional resistor R should be at least ten times greater than load resistance Rz. Then the curve follows the solid line in FIG. 1, showing input resistance R1 as a single-valued function of load resistance Rz.

If the load Rz connected to the secondary side is the squib of an air bag, for example, whose resistance is normally approximately 2 Ω, then an additional resistance R of approximately 100 Ω should be selected. Since, when measuring input resistance R1 it only must be clearly determined whether the squib resistance is greater than 5 or 6 Ω (which indicates malfunction), it is unimportant whether input resistance R1 stays at a constant higher value for much greater load resistances Rz.

Of course, the precondition for error-free checking of the load resistance is that the additional resistor R is kept free of interference, e.g., contact interruptions. The options for connecting the additional resistor R are shown in FIGS. 2 through 5.

Figure 2:
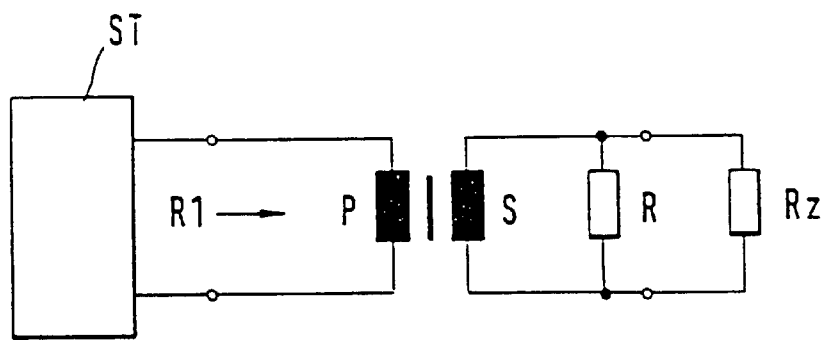
FIG. 2 shows a transformer with a secondary winding and a parallel circuit connected thereto consisting of a load resistance and an additional resistance.
Figure 3:
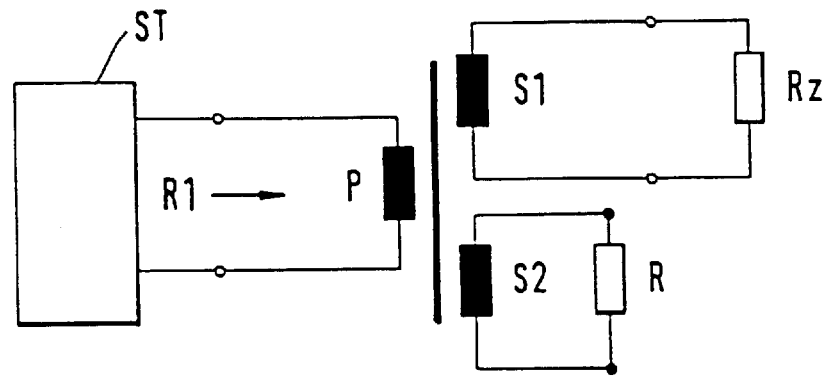
FIG. 3 shows a first transformer with two secondary windings.

FIG. 2 schematically shows a transformer with primary winding P and secondary winding S. Load resistance Rz connected to secondary winding S is connected in parallel to additional resistance R. A control circuit ST, measuring the primary-side input resistance R1 of the transformer using known means, is connected to primary winding P. In order to mechanically protect additional resistance R against contact interruptions, it is convenient to integrate it in a pot-type core, which accommodates the secondary winding. According to the embodiment illustrated in FIG. 3, two secondary windings S1 and S2 are provided. Load resistance Rz is connected to secondary winding S1, and additional resistance R is connected to secondary winding S2. Thus, additional resistance R is not conductively connected to the secondary load circuit, which could conceivably be a source of malfunction. Additional resistance R can, as indicated in FIG. 2, be a separate resistor, which in turn can be integrated in the secondary pot-type core of the transformer. Additional resistance R is preferably made of a material that is unaffected by temperature.

Figure 4:
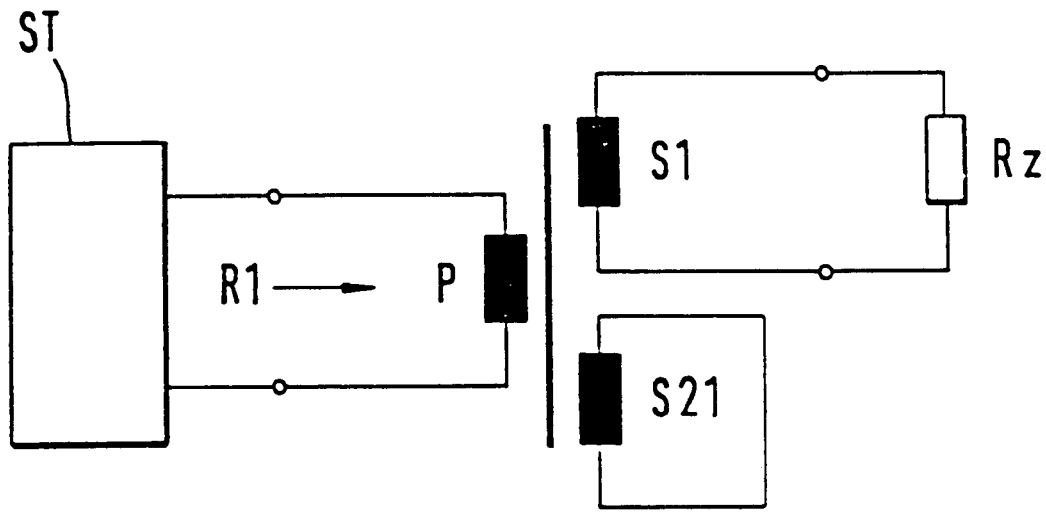
FIG. 4 shows a second transformer with two secondary windings.

In the embodiment illustrated in FIG. 4, there is, in addition to secondary winding S1 that is responsible for load resistance Rz, a second secondary winding S21, which has an inherent resistance equal to secondary resistance R and whose terminals short-circuit one another. This second secondary winding S21 is made, for example, of a high-resistance constantan or manganese wire that is unaffected by temperature. A resistance R as an additional component is therefore no longer necessary, which considerably reduces the possibility of malfunction. Secondary winding S21 can be cast into the pot-type core of the transformer to safeguard it from mechanical damage.

Figure 5:
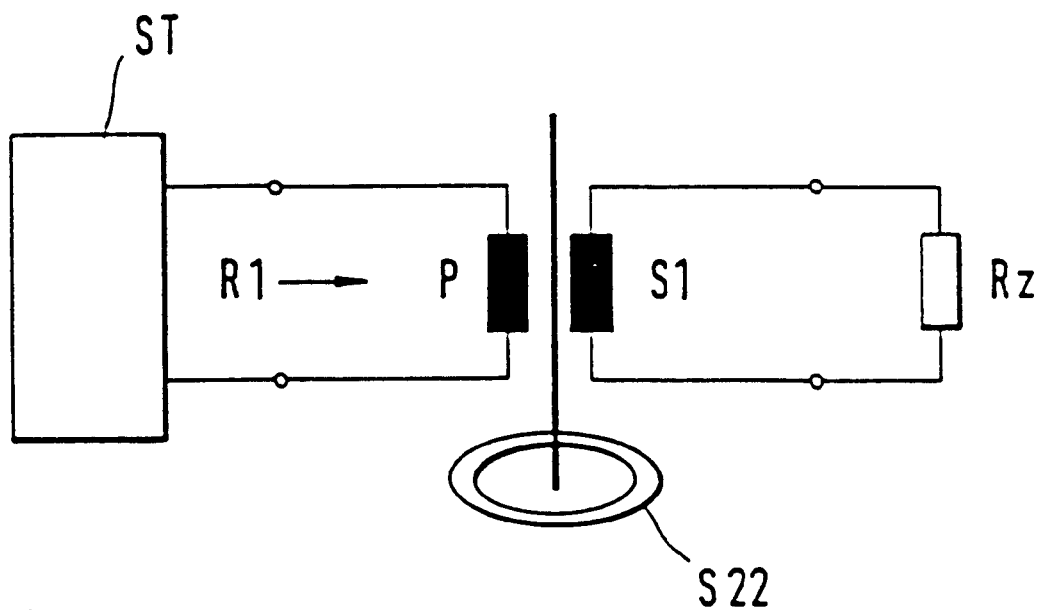
FIG. 5 shows a transformer that, in addition to a first secondary winding connected to the load resistance, has a secondary-side ring constituting the additional resistor.

Instead of a second secondary winding S21, a solid metal ring made of a resistor material that is unaffected by temperature can also be used, as indicated in FIG. 5. The lower inherent resistance of this ring is, however, measured from the primary side increased by a factor of $1/\ddot{u}^2$. Since $1/\ddot{u}^2$ is equal to the square of the primary-to-secondary wind ratio, and the secondary winding has one turn, the factor $1/\ddot{u}^2$ is large and corresponds to the square of the number of turns of the primary winding.

What is claimed is:

1. An arrangement for checking a resistance of a load, comprising:

a transformer having a primary side and a secondary side;

a resistor coupled to the secondary side of the transformer, the load being coupled to the secondary side of the transformer, the resistor having a resistance that is at least ten times greater than a resistance of the load; and a circuit arrangement measuring an input resistance of the primary side of the transformer and signaling a load malfunction when the input resistance differs from a preselected value.

2. The arrangement according to claim 1, wherein the load includes a squib of an air bag.

3. The arrangement according to claim 1, wherein the resistor is integrated in a pot-type core, the pot-type core accommodating the secondary side of the transformer.

4. The arrangement according to claim 1, wherein the secondary side of the transformer includes two electrically isolated secondary windings for transforming the load and the resistor into the primary side of the transformer.

5. The arrangement according to claim 1, wherein the resistor is formed of a wire.

6. The arrangement according to claim 4, wherein the resistor is formed of a wire, and the wire short-circuits one of the two secondary windings.

7. The arrangement according to claim 1, wherein the resistor includes a ring arranged on the secondary side of the transformer.

* * * * *